(12) United States Patent
Leal et al.

(10) Patent No.: US 7,361,987 B2
(45) Date of Patent: Apr. 22, 2008

(54) CIRCUIT DEVICE WITH AT LEAST PARTIAL PACKAGING AND METHOD FOR FORMING

(75) Inventors: George R. Leal, Cedar Park, TX (US); Jie-Hua Zhao, Austin, TX (US); Edward R. Prack, Austin, TX (US); Robert J. Wenzel, Austin, TX (US); Brian D. Sawyer, Mesa, AZ (US); David G. Wontor, Austin, TX (US); Marc Alan Mangrum, Manchaca, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 317 days.

(21) Appl. No.: 11/148,691

(22) Filed: Jul. 19, 2005

(65) Prior Publication Data

US 2006/0012036 A1    Jan. 19, 2006

Related U.S. Application Data

(62) Division of application No. 10/418,790, filed on Apr. 18, 2003, now Pat. No. 6,921,975.

(51) Int. Cl.
*H01L 23/34* (2006.01)

(52) U.S. Cl. .................. 257/723; 257/724; 257/734; 257/773; 257/776; 257/783; 257/787; 257/E23.178; 257/E21.513; 257/E21.514

(58) Field of Classification Search ........ 257/723–725, 257/678, 684, 691, 729–734, 774, 776, 783, 257/786–789, 795, 924, E23.079, E23.178, 257/E23.181, E21.502–E21.514
See application file for complete search history.

(56) References Cited

U.S. PATENT DOCUMENTS

| 4,630,096 | A | 12/1986 | Drye |
| 4,722,914 | A | 2/1988 | Drye |
| 4,783,695 | A | 11/1988 | Eichelberger |
| 4,792,533 | A | 12/1988 | Drye |
| 4,890,156 | A | 12/1989 | Drye |
| 5,161,093 | A | 11/1992 | Gorczyca |
| 5,315,486 | A | 5/1994 | Fillion |

(Continued)

FOREIGN PATENT DOCUMENTS

EP      0777274 A1      6/1997

(Continued)

*Primary Examiner*—Jasmine Clark
(74) *Attorney, Agent, or Firm*—Susan C. Hill; Joanna G. Chiu

(57) ABSTRACT

A circuit device (15) is placed within an opening of a conductive layer (10) which is then partially encapsulated with an encapsulant (24) so that the active surface of the circuit device (15) is coplanar with the conductive layer (10). At least a portion of the conductive layer (10) may be used as a reference voltage plane (e.g. a ground plane). Additionally, a circuit device (115) may be placed on a conductive layer (100) such that an active surface of circuit device (115) is between conductive layer (100) and an opposite surface of circuit device (115). The conductive layer (100) has at least one opening (128) to expose the active surface of circuit device (115). The encapsulant (24, 126, 326) may be electrically conductive or electrically non-conductive.

15 Claims, 3 Drawing Sheets

U.S. PATENT DOCUMENTS

| | | |
|---|---|---|
| 5,353,498 A | 10/1994 | Fillion |
| 5,525,834 A * | 6/1996 | Fischer et al. ............... 257/691 |
| 5,592,025 A | 1/1997 | Clark |
| 5,841,193 A | 11/1998 | Eichelberger |
| 5,989,935 A | 11/1999 | Abbott |
| 6,159,767 A | 12/2000 | Eichelberger |
| 2002/0064931 A1 | 5/2002 | Ong |

FOREIGN PATENT DOCUMENTS

| | | |
|---|---|---|
| WO | WO 02/21595 A2 | 3/2002 |
| WO | WO 02/33751 A2 | 4/2002 |

* cited by examiner

US 7,361,987 B2

CIRCUIT DEVICE WITH AT LEAST PARTIAL PACKAGING AND METHOD FOR FORMING

RELATED APPLICATIONS

This is a divisional patent application of U.S. patent application Ser. No. 10/418,790, filed Apr. 18, 2003, now U.S. Pat. No. 6,921,975.

FIELD OF THE INVENTION

The present invention generally relates to a circuit device, and more particularly, to a circuit device with at least partial packaging and method for forming.

RELATED ART

Circuit devices of all types, including but not limited to electrical, optical, active, and passive, are generally packaged in a form that protects the circuit device, allows coupling external to the circuit device when desired, and is as low cost as possible while still allowing the functional use of the circuit device. Using standard, already existing packaging tools and processes where possible to improve the packaging of circuit devices is a low cost approach to the advancement of circuit device packaging.

It is becoming more common to commercially transfer or sell circuit devices that have only been partially packaged. These partially packaged circuit devices can then be optionally combined with other circuit devices and packaged in a final form to produce the desired final circuit.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
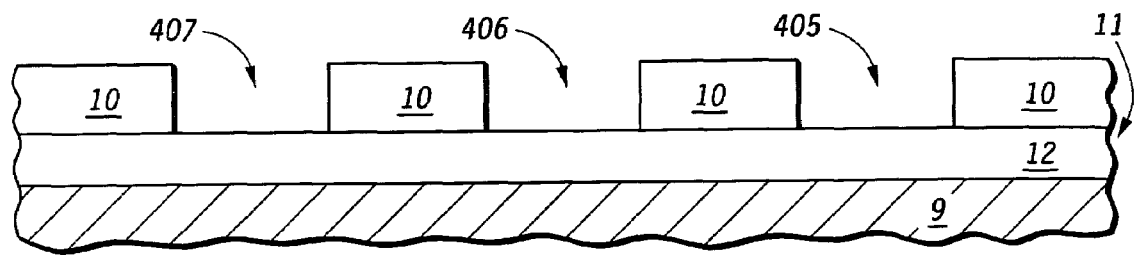
FIGS. 1-4 include illustrations of sequential cross-sectional views of a plurality of circuit devices with at least partial packaging formed in accordance with one embodiment of the present invention.

FIG. 1 illustrates a cross-sectional view of an electrically conductive layer 10 placed overlying an adhesive layer 12. In some embodiments of the present invention, a support structure 9 is used to provide support for adhesive layer 12. The interface between the electrically conductive layer 10 and the adhesive layer 12 forms a plane 11. Electrically conductive layer 10 may be formed of any material that is electrically conductive. In some embodiments of the present invention, electrically conductive layer 10 may be an electrically conductive frame, such as, for example, a leadframe. A leadframe may be formed of any electrically conductive material of suitable properties, such as, for example, copper or alloy 42. In alternate embodiments of the present invention, electrically conductive layer 10 may be an electrically conductive substrate, such as, for example, a multi-layer substrate which includes a plurality of interconnect layers. Adhesive layer 12 may be formed of any material that is adhesive. In one embodiment of the present invention, adhesive layer 12 is a tape having an adhesive surface in contact with electrically conductive layer 10 along plane 11. In an alternate embodiment of the present invention, adhesive layer 12 may not have any adhesive applied until FIG. 2. In one embodiment of the present invention, electrically conductive layer 10 has openings 405-407. Alternate embodiments of the present invention may have any number of openings, of any shape, in electrically conductive layer 10.

Figure 2:
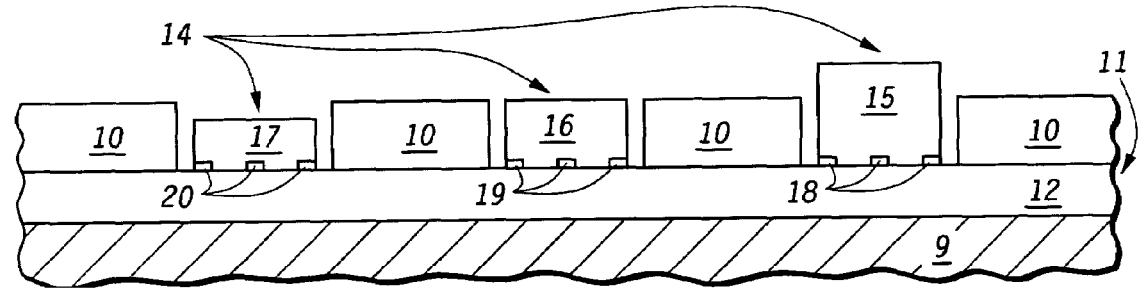

FIG. 2 illustrates a sequential cross-sectional view of FIG. 1 in which a plurality of circuit devices 14 have been added. The plurality of circuit devices 14 includes a circuit device 15 which has been placed in opening 405, a circuit device 16 which has been placed in opening 406, and a circuit device 17 which has been placed in opening 407. Note that openings 405-407 at least partially surround their corresponding circuit device 15-17. In some embodiments of the present invention, openings 405-407 fully surround their corresponding circuit device 15-17. Note that in alternate embodiments of the present invention, more than one circuit device (e.g. 15-17) may be located within a single opening (405-407). One or more of the plurality of circuit devices 14 may be identical circuit devices that perform the same function, or may be different circuit devices that perform different functions. In some embodiments of the present invention, adhesive is applied to one or more of circuit devices 14 before the circuit devices 14 are placed in their respective openings 405-407. The adhesive applied to one or more of circuit devices 14 then comes in contact with layer 12 and forms the adhesive portion of adhesive layer 12 which holds circuit devices in place during a subsequent encapsulation step (see FIG. 3).

Circuit devices 14 have at least one surface which is active and which is substantially coplanar with a surface of the electrically conductive layer 10 (e.g. along plane 11 in the embodiment illustrated in FIG. 2). In the illustrated embodiment, the active surface of circuit devices 15-17 are considered the bottom of circuit devices 15-17, and these bottom surfaces are adhesively coupled to adhesive layer 12. In the embodiment illustrated in FIG. 2, the active surface of circuit device 15 includes a plurality of contact pads 18, the active surface of circuit device 16 includes a plurality of contact pads 19, and the active surface of circuit device 17 includes a plurality of contact pads 20. Alternate embodiments of the present invention may include more or fewer contact pads on each individual one of circuit devices 14. These contact pads 18-20 were formed on circuit device 15-17 in any manner using a variety of processes and materials known in the art. In one embodiment of the present invention, at least one opening 405-407 (see FIG. 1) at least partially surrounds at least one of circuit devices 15-17.

Figure 3:
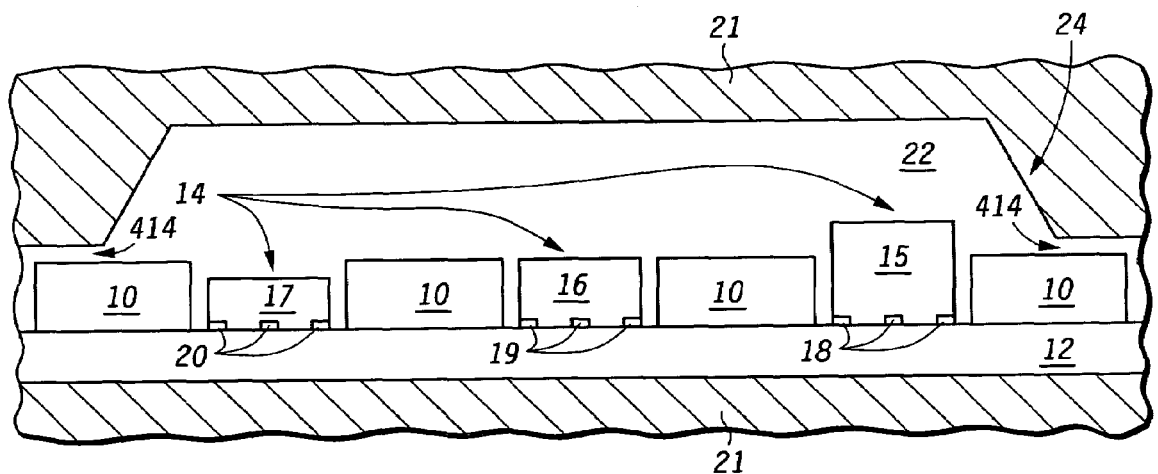

FIG. 3 illustrates a sequential cross-sectional view of FIG. 2 in which a die set 21 has been added, thus forming a cavity 22. The encapsulant will be provided by way of one or more openings 414 using any appropriate encapsulating method, such as, for example, injection molding or transfer molding. Other methods of encapsulation may alternately be used, such as, for example, dispense molding and cavity injection molding.

Figure 4:
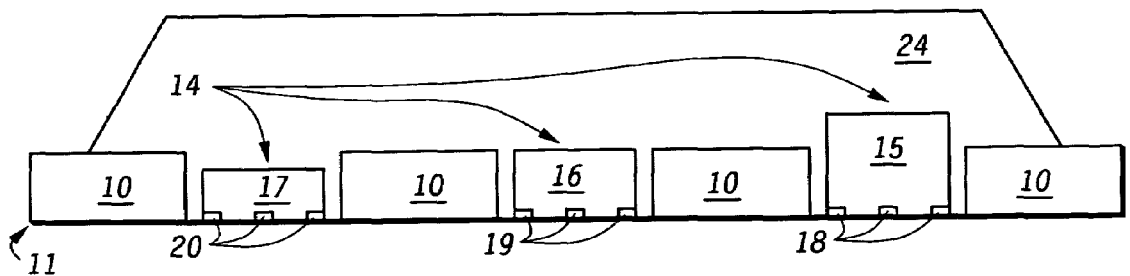

FIG. 4 illustrates a sequential cross-sectional view of FIG. 3 in which the die set 21 has been removed after cavity 22, including one or more gaps between circuit devices 14 and electrically conductive layer 10, has been partially or fully filled with encapsulant layer 24. For some embodiments of the present invention, adhesive layer 12 may be removed, for example, if the adhesive layer 12 is an adhesive tape. In some embodiments of the present invention, encapsulant layer 24 may be any type of non-electrically conductive material that can be molded, such as, for example, thermoset mold compounds or filled thermoplastic resins which act as insulating materials. In alternate embodiments of the present invention, encapsulant layer 24 may be any type of electrically conductive material that can be molded, such as, for example, thermoset epoxy with metallic filler or thermoplastic with metallic filler. The metallic filler may be any suitable electrically conductive material, such as, for example, silver, copper, electrically conductive coated polymer spheres, and conductive nano-particles. The metallic filler may be in particle form. Note that in some embodiments of the present invention, the electrically conductive layer 10, or portions thereof, act as a reference voltage plane, such as, for example, a ground plane or a higher voltage reference plane. One benefit of such a voltage reference plane is enabling one or more controlled impedance circuits, such as, for example, conductor 461 (see FIG. 8) to be fabricated within interconnect layer 328.

Figure 5:
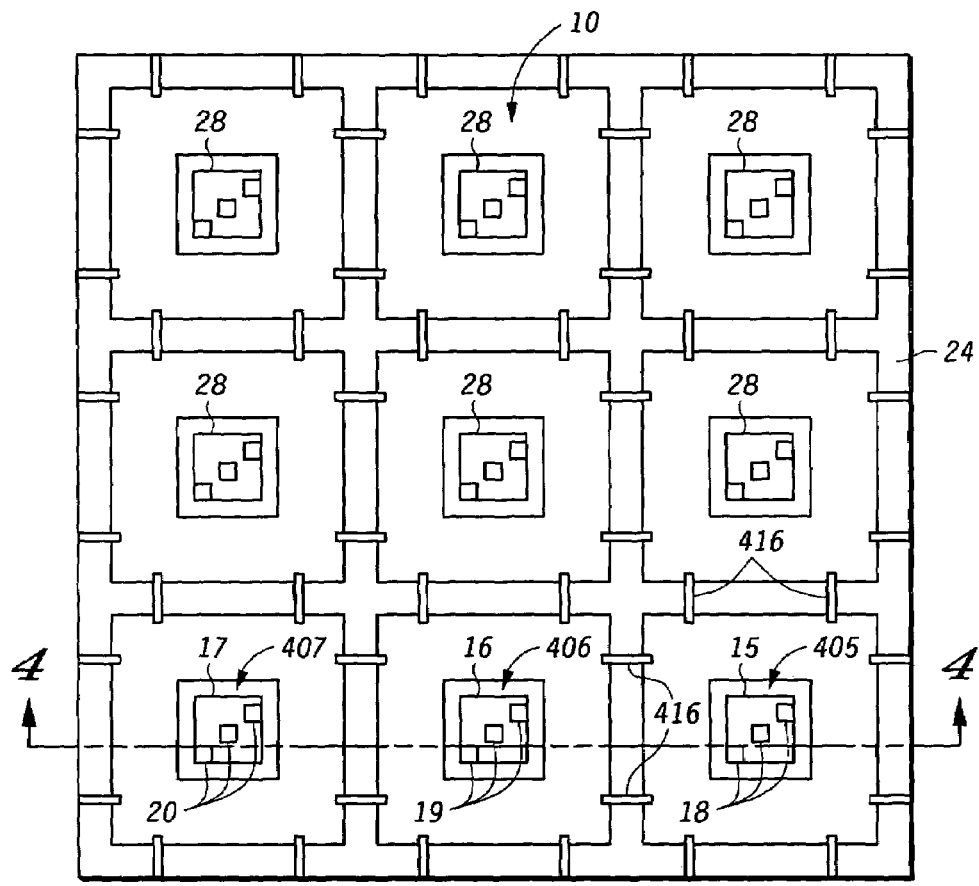
FIG. 5 illustrates a bottom view of the plurality of circuit devices with at least partial packaging of FIG. 4 formed in accordance with one embodiment of the present invention.

FIG. 5 illustrates an approximate bottom view of the plurality of circuit devices 15-17 with at least partial packaging of FIG. 4 formed in accordance with one embodiment of the present invention. The structure illustrated in FIG. 5 also includes a plurality of additional circuit devices 28 which are not illustrated in FIG. 4. In alternate embodiments of the present invention, circuit devices 15-17 and 28 may include any number of circuit devices, and may be arranged in a one-dimensional or two-dimensional array of any reasonable size. The array may or may not be symmetrical.

In one embodiment of the present invention, electrically conductive layer 10 is illustrated as an array of voltage reference planes with openings to receive circuit devices 15-17 and 28. Note that in the embodiment of the present invention illustrated in FIG. 5, the voltage reference planes are held together by a plurality of spars (e.g. spars 416), which are part of electrically conductive layer 10, and which are not illustrated in FIGS. 1-4 for clarity purposes. Alternate embodiments of the present invention may not use spars 416. Spars 416 provide a way to physically connect a plurality of voltage reference planes having openings (e.g. 405-406) so that the partial or complete packaging of more than one circuit device (e.g. 15 and 16) can be performed simultaneously using the same electrically conductive layer 10. In some embodiments of the present invention, the spars 416 may be secured to an outer rail or frame (not shown). Singulation can then be achieved by cutting through the spars 416 and other materials located between reference planes 405-407. Note that the circuit devices 15-17 and 28 may be singulated by cutting through the appropriate spars 416 surrounding each individual circuit device 15-17, 28.

Figure 6:
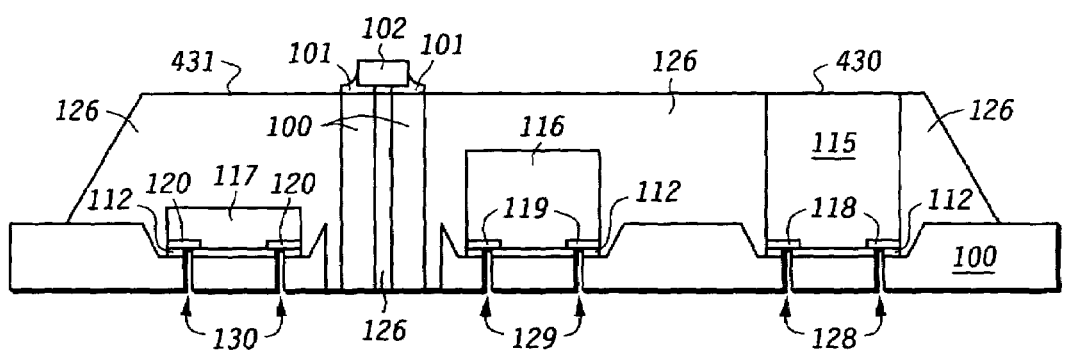
FIG. 6 illustrates a cross-sectional view of a plurality of circuit devices with at least partial packaging formed in accordance with one embodiment of the present.

FIG. 6 illustrates a cross-sectional view of a plurality of circuit devices 115-117 with at least partial packaging formed in accordance with one embodiment of the present.

Adhesive layer 112 is interposed between electrically conductive layer 100 and circuit devices 115-117. Encapsulating layer 126 may be formed in the same manner and of the same materials as encapsulating layer 24 of FIG. 4. One or more openings 128 in electrically conductive layer 100 may be used to allow electrical connection with one or more contact pads 118 on the active surface of circuit device 115. One or more openings 129 in electrically conductive layer 100 may be used to allow electrical connection with one or more contact pads 119 on the active surface of circuit device 116. One or more openings 130 in electrically conductive layer 100 may be used to allow electrical connection with one or more contact pads 120 on the active surface of circuit device 117. Note that electrically conductive layer 100 may be thinned in the area where circuit devices (e.g. 115-117) are placed in order to simplify the processing used to form interconnects through openings 128-130. Within the embodiment illustrated in FIG. 6, the conductive layer 100 can act as a stress decoupling layer between circuit devices 117-119 and any subsequently added interconnect layer(s) (e.g. 328 in FIG. 8) thereby improving potential reliability. This stress buffering function may be in addition to conductive layer 100 acting as a reference plane.

Note that in the embodiment illustrated in FIG. 6, an active surface of circuit devices 115-117 is substantially coplanar with one surface of electrically conductive layer 100, while the opposite surface, either active or non-active, may be totally encapsulated by encapsulating layer 126 (as for circuit devices 116 and 117), or alternately may be substantially coplanar with the opposite surface 431 of encapsulating layer 126 (as for circuit device 115). If the opposite surface 430 of device 15 is substantially coplanar with the opposite surface 431 of encapsulating layer 126, then it is possible to directly attach a heat sink (not shown) to the surface 430 of circuit device 115 in order to dissipate heat from circuit device 115. This may be especially important if circuit device 115 is a circuit device which uses a significant amount of power. Having the opposite surface 430 of a circuit device (e.g. circuit device 15) be substantially coplanar with a surface 431 of encapsulating layer 126 may be used in any appropriate embodiment of the present invention, including, for example, the embodiments illustrated and described for FIG. 4 and FIG. 8. Note also that the bottom of each circuit device 115-117 having an active surface is located between the top of that circuit device 115-117 and the top of the electrically conductive layer 100.

Electrically conductive layer 100 may be formed of any material that is electrically conductive and has suitable properties. In some embodiments of the present invention, electrically conductive layer 100 may be an electrically conductive frame, such as, for example, a leadframe. A leadframe may be formed of any electrically conductive material, such as, for example, copper or alloy 42. In alternate embodiments of the present invention, electrically conductive layer 100 may be an electrically conductive substrate, such as, for example, a multi-layer substrate which includes a plurality of interconnect layers. Adhesive layer 112 may be formed of any material that is adhesive. In one embodiment of the present invention, adhesive layer 112 is a tape having an adhesive surface in contact with electrically conductive layer 100. In an alternate embodiment of the present invention, adhesive layer 112 may not have any adhesive applied until circuit devices 115-117 are placed on electrically conductive layer 100 using an adhesive interposed between adhesive layer 12 and circuit devices 115-117. In some embodiments, adhesive layer 12 may be a tape or liquid adhesive such as an epoxy applied via dipping, dispensing, or stamp transfer prior to placement of circuit devices 115-117.

FIG. 6 also illustrates that electrically conductive layer 100 may have one or more portions which are substantially coplanar with the same opposite surface 431 of encapsulating layer 126. FIG. 6 illustrates an example in which an electrical device 102 has been coupled to portions of electrically conductive layer 100 by way of contact pads/interconnection 101 using various methods known in the art, such as, for example soldering or conductive adhesive. Electrical device 102 may be any type of active or passive device, and may have any number of terminals. Note that in some embodiments of the present invention, electrical device 102 is not embedded in encapsulant 126, and thus is easily accessible for testing and replacement purposes.

Figure 7:
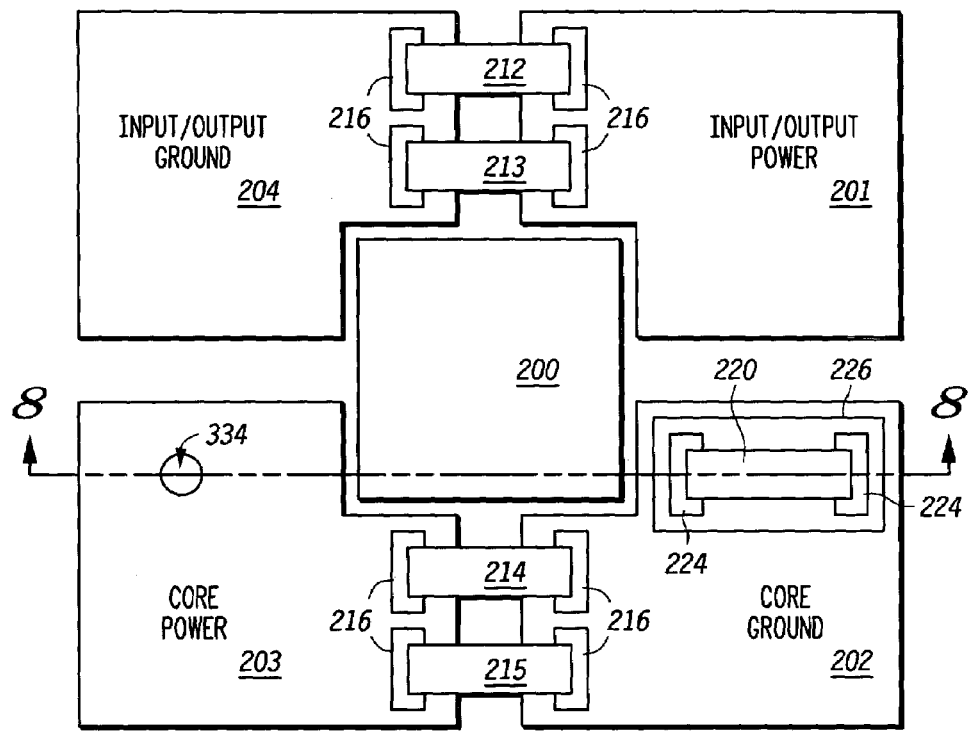
FIG. 7 illustrates a top view of a circuit device with at least partial packaging formed in accordance with one embodiment of the present invention.
Figure 8:
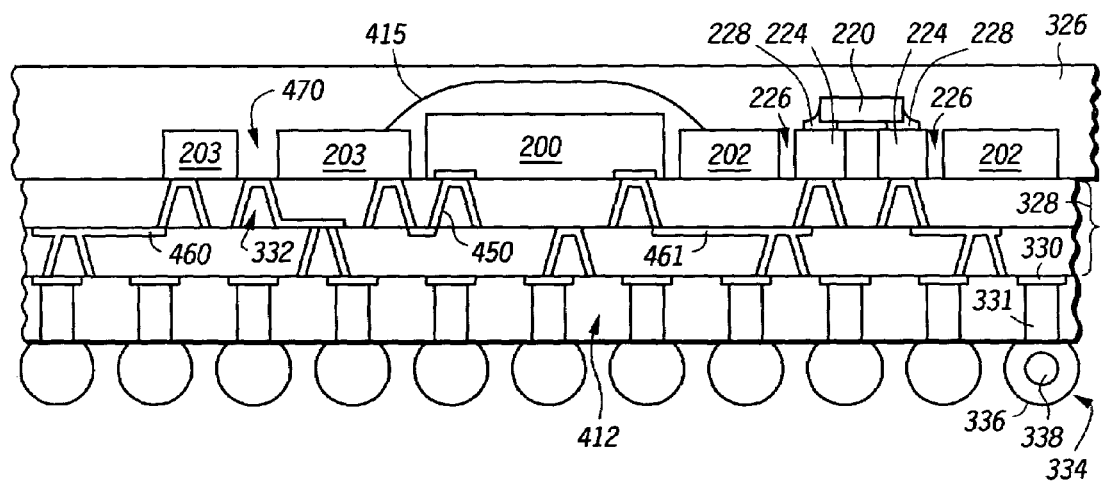
FIG. 8 illustrates a cross-sectional view of the circuit device with at least partial packaging of FIG. 7 formed in accordance with one embodiment of the present invention.

FIG. 7 illustrates a top view of a circuit device 200 with at least partial packaging formed in accordance with one embodiment of the present invention. In one embodiment of the present invention, circuit device 200 may be an integrated circuit die. Note that in some embodiments of the present invention, circuit devices 15-17, 28 (see FIGS. 1-5), and circuit devices 115-117 (see FIG. 6) may also be integrated circuit die. FIG. 8 illustrates a cross-sectional view of the circuit device 200 with at least partial packaging of FIG. 7.

FIG. 7 illustrates a circuit device 200 which is electrically coupled to receive a higher voltage from a voltage reference plane called input/output power 201, which is electrically coupled to receive a higher from a voltage reference plane called core power 203, which is electrically coupled to receive a lower or ground voltage from a voltage reference plane called input/output ground 204, and which is electrically coupled to receive a lower or ground voltage from a voltage reference plane called core ground 202. In some embodiments of the present invention input/output power 201, core power 203, input/output ground 204, and core ground 202 are all portions of an electrically conductive layer which are electrically isolated from each other. In one embodiment of the present invention, input/output power 201 and input/output ground 204 are electrically decoupled by way decoupling capacitors 212 and 213. Similarly, core power 203 and core ground 202 may be electrically decoupled by way decoupling capacitors 214 and 215. Note that in the illustrated embodiment, contact pads 216 are used to electrically connect capacitors 212-215 to voltage reference planes 201-204. Decoupling capacitors 212-215 can be electrically coupled to contact pads 216 using various methods known in the art, such as, for example, soldering or conductive adhesive.

Referring to FIGS. 7 and 8, note that in some embodiments of the present invention, circuit device 200 may be electrically coupled to the core power portion 203 of the electrically conductive layer (201-204, 224) by way of portion 450 of interconnect layer 328. In alternate embodiments, circuit device 200 may be electrically coupled to any desired portion (e.g. 201-204) of the electrically conductive layer (201-204, 224). Note that the electrically conductive layer (201-204, 224), or electrically isolated portions thereof, may function as one or more reference voltage planes.

For some embodiments of the present invention, the encapsulant layer 326 (see FIG. 8) may be electrically conductive. If the encapsulant layer 326 is electrically conductive, one or more openings (e.g. opening 470) may be formed through the conductive layer (202, 203, 224) to the interconnect layer 328. Opening 470 is an opening in a portion 203 of the conductive layer (203, 202, 224). Opening 470 may be used to electrically connect encapsulant 326 to one or more portions of interconnect layer 328 by way of via 332. For example, encapsulant layer 326 may be used as a voltage reference plane by electrically coupling the appropriate voltage (e.g. power or ground) to encapsulant layer 326 by way of opening 470, via 332, and interconnect layer 328. In this embodiment, even if conductive layer 202, 263 is small in area coverage, controlled impedance circuits, such as, for example, conductor 460 (see FIG. 8), are possible within interconnect layer 328 with encapsulant layer 326 acting as the reference plane. Encapsulant layer 326 may also perform an electrical shielding function for circuit device 200. Note that if encapsulant layer 326 is electrically conductive, then an electrical device (e.g. 220) will not be encapsulated within encapsulation layer 326 as illustrated in FIG. 8 due to the fact that its terminals would be electrically shorted.

Alternate embodiments of the present invention may not use encapsulant that is electrically conductive. Referring to FIG. 8, if the encapsulant layer 326 is electrically non-conductive, then an electrically conductive layer 415 can be formed overlying circuit device 200 in order to provide electrical shielding and a voltage reference. Note that electrically conductive layer 415 may be formed as part of a multi-step encapsulation process. Electrically non-conductive encapsulant 326 may then be formed overlying layer 415 as a subsequent part of the multi-step encapsulation process. In alternate embodiments of the present invention, more than one circuit device (e.g. 200) may be located within a single electrically conductive layer 415.

Interconnect layer 328 may include one or more levels of interconnect and may be formed using a variety of circuitizing processes known in the art such as, for example, high density interconnect build-up, lamination, or thin film processing. In some embodiments of the present invention, via 331 through compliant polymer layer 412 couples contact pad 330 of interconnect layer 328 to electrically conductive ball 334. Alternate embodiments of the present invention may have a plurality of such vias to electrically connect interconnect layer 328 and a plurality of balls (e.g. 334). Electrically conductive ball 334 may be formed of any appropriate conductive material, such as, for example, solder, or solder 336 surrounding a polymer core 338. Note that in some embodiments of the present invention, the structure below interconnect layer 328 (e.g. 412, 331, 330, 334) may function to provide stress buffering between interconnect layer 328 and a further structure (not shown) which is subsequently attached to electrically conductive balls (e.g. 334).

In some embodiments of the present invention, an electrical device 220, either passive or active, may be electrically coupled to the top surface of the electrically conductive layer 224, which is itself an isolated portion of conductive layer 202. Note that the left portion of 224 which is electrically coupled to a left terminal of electrical device 220 may be electrically isolated from the right portion of 224 which is electrically coupled to a right terminal of electrical device 220. In one embodiment, electrical device 220 is electrically coupled to electrically conductive layer 224 by way of one or more contact pads 228 fabricated on the top surface of 224. Thus, electrical device 220 may be electrically coupled to interconnect layer 328 by way of conductive layer 224. In some embodiments of the present invention, one or more portions (e.g. 226) of encapsulant layer 326 may act to isolate one or more portions of the conductive layer (e.g. 224). Electrical coupling of device 220 may be performed using various methods known in the art, such as, for example, soldering or conductive adhesive. Note that in some embodiments of the present invention, conductive layer 224 may be reduced in height compared to remaining portions of conductive layer 202-203 allowing for a lower attachment height for circuit device 220 and a lower potential profile for the package.

Electrically conductive layer (202, 203, 224) may be formed of any suitable material that is electrically conductive. In some embodiments of the present invention, electrically conductive layer (202, 203, 224) may be an electrically conductive frame, such as, for example, a leadframe. A leadframe may be formed of any electrically conductive material, such as, for example, copper or alloy 42. In alternate embodiments of the present invention, electrically conductive layer (202, 203, 224) may be an electrically conductive substrate, such as, for example, a multi-layer substrate which includes a plurality of interconnect layers.

Note that if interconnect layer 328 is formed using the same category of material as encapsulant 326, such as, for example, thermoplastics such as liquid crystal polymer (LCP) or polyphenylene sulfide (PPS), then circuit device 200 and its corresponding interconnects within 328 can be encased in a seamless, monolithic block of material and the horizontal lines representing interfaces between encapsulation 326 and interconnect layer 328 illustrated in FIG. 8 will no longer be present. Such a package configuration could demonstrate improved reliability due to less moisture ingress and a reduced number of interfaces between dissimilar materials that could delaminate. In one embodiment of the present invention, a lamination technique for the fabrication of interconnect layer 328 may be used for the case in which the same category of material is used for both encapsulant 326 and interconnect layer 328. Also, note that injection molding may be used to apply encapsulant 326 in this case.

Note that in some embodiments of the present invention where encapsulant 126 is not electrically conductive, one or more portions of the electrically conductive layer (e.g. 100 of FIG. 6; 201-204 and 224 of FIG. 7; and 224 of FIG. 8) may be physically separate or otherwise electrically isolated from other portions of the electrically conductive layer to provide electrical connections to other devices (e.g. 102 of FIG. 6 and 220 of FIG. 8).

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A device with at least partial packaging, comprising:
   a circuit device having a first surface and a second surface opposite the first surface, wherein the first surface comprises active circuitry;
   an electrically conductive layer having a first surface, a second surface opposite the first surface, and at least one opening, wherein:
   the at least one opening at least partially surrounds the circuit device,
   the first surface of the circuit device is substantially coplanar with the first surface of the electrically conductive layer, and
   the electrically conductive layer comprises a first reference voltage plane;
   an electrical contact, electrically coupled to the first reference voltage plane, said electrical contact enabling electrical contact to be made to said first reference voltage plane; and
   an encapsulant layer at least partially filling a gap within the at least one opening between the circuit device and the electrically conductive layer, wherein the encapsulant layer overlies at least a first portion of the second surface of the electrically conductive layer.

2. The device of claim 1, wherein the encapsulant layer comprises an electrically conductive material.

3. The device of claim 1, wherein the encapsulant layer overlies at least a portion of the second surface of the circuit device.

4. The device of claim 1, further comprising a second circuit device in physical contact with a second portion of the second surface of the electrically conductive layer.

5. The device of claim 4, wherein the second circuit device is selected from a group consisting of a passive device, an optical device, an active device, and a semiconductor device, an antennae, and a micro-electro-mechanical system (MEMS) device.

6. The device of claim 4, wherein the encapsulant layer overlies at least a portion of the second circuit device.

7. The device of claim 1, wherein the first reference voltage plane is electrically coupled to the circuit device.

8. A device with at least partial packaging, comprising:
   a circuit device having a first surface and a second surface opposite the first surface, wherein the first surface comprises active circuitry;
   an electrically conductive layer having a first surface, a second surface opposite the first surface, and at least one opening, wherein:
   the at least one opening at least partially surrounds the circuit device,
   the first surface of the circuit device is substantially coplanar with the first surface of the electrically conductive layer, and
   the electrically conductive layer comprises a first reference voltage plane;
   an electrical contact, electrically coupled to the first reference voltage plane, said electrical contact enabling electrical contact to be made to said first reference voltage plane; and
   an encapsulant layer at least partially filling a gap within the at least one opening between the circuit device and the electrically conductive layer, wherein the encapsulant layer overlies at least a portion of the second surface of the circuit device.

9. A device with at least partial packaging, comprising:
a circuit device having a first surface and a second surface opposite the first surface, wherein the first surface comprises active circuitry;
an electrically conductive layer having a first surface, a second surface opposite the first surface, and at least one opening, wherein:
the at least one opening at least partially surrounds the circuit device,
the first surface of the circuit device is substantially coplanar with the first surface of the electrically conductive layer, and
the electrically conductive layer comprises a first reference voltage plane;
an electrical contact, electrically coupled to the first reference voltage plane, said electrical contact enabling electrical contact to be made to said first reference voltage plane;
an encapsulant layer at least partially filling a gap within the at least one opening between the circuit device and the electrically conductive layer; and
a plurality of circuit devices, wherein said circuit device is a first one of the plurality of circuit devices, wherein the electrically conductive layer comprises a plurality of openings, wherein each of the plurality of openings at least partially surrounds one of the plurality of circuit devices.

10. The device of claim 9, wherein each of the plurality of circuit devices has a first surface comprising active circuitry and a second surface opposite the first surface, wherein the first surfaces of each of the plurality of the circuit devices is substantially coplanar with the first surface of the electrically conductive layer.

11. The device of claim 10, wherein the encapsulant layer overlies at least a portion of the second surfaces of the plurality of circuit devices.

12. The device of claim 11, wherein the encapsulant layer comprises an electrically conductive material.

13. A method for forming a device having at least partial packaging, comprising:
providing an electrically conductive layer having a first surface, a second surface opposite the first surface, and at least one opening;
attaching an adhesive layer to the electrically conductive layer;
placing a circuit device on the adhesive layer within the at least one opening, wherein an active surface of the circuit device is substantially coplanar with the first surface of the electrically conductive layer, and wherein the electrically conductive layer comprises a reference voltage plane;
providing an electrical contact electrically coupled to the reference voltage plane;
forming an encapsulant layer to at least partially fill a gap within the at least one opening between the circuit device and the electrically conductive layer; and
removing the adhesive layer after forming the encapsulant layer.

14. The method of claim 13, wherein the adhesive layer comprises a tape.

15. A method for forming a device having at least partial packaging, comprising:
providing an electrically conductive layer having a first surface, a second surface opposite the first surface, and at least one opening;
attaching an adhesive layer to the electrically conductive layer;
placing a circuit device on the adhesive layer within the at least one opening, wherein an active surface of the circuit device is substantially coplanar with the first surface of the electrically conductive layer, and wherein the electrically conductive layer comprises a reference voltage plane;
providing an electrical contact electrically coupled to the reference voltage plane;
forming an encapsulant layer to at least partially fill a gap within the at least one opening between the circuit device and the electrically conductive layer, wherein forming the encapsulant layer comprises forming a mold compound overlying the circuit device and the second surface of the electrically conductive layer.

* * * * *